United States Patent [19]

DePaolis, Jr.

[11] Patent Number: 4,617,477
[45] Date of Patent: Oct. 14, 1986

[54] SYMMETRICAL OUTPUT COMPLEMENTARY BUFFER

[75] Inventor: Michael V. DePaolis, Jr., Center Valley, Pa.

[73] Assignee: AT&T Bell Laboratories, Murray Hill, N.J.

[21] Appl. No.: 736,554

[22] Filed: May 21, 1985

[51] Int. Cl.[4] .................. H03K 19/094; H03K 19/20; H03K 17/693; H03K 3/86
[52] U.S. Cl. .................................... 307/443; 307/451; 307/579; 307/475; 307/269; 307/513; 307/601; 307/602; 307/605
[58] Field of Search ............... 307/443, 449, 451, 454, 307/579, 585, 475, 269, 270, 513, 601–603, 605, 279, 479

[56] References Cited

U.S. PATENT DOCUMENTS

| | | | |
|---|---|---|---|
| 3,591,855 | 7/1971 | Dean et al. | 307/475 |
| 3,659,286 | 4/1972 | Perkins et al. | 307/448 X |
| 3,851,189 | 11/1974 | Moyer | 307/279 |
| 4,074,148 | 2/1978 | Sato | 307/269 X |
| 4,296,339 | 10/1981 | Murotani | 307/475 X |
| 4,301,535 | 11/1981 | McKenny | 307/481 X |
| 4,451,745 | 5/1984 | Itoh et al. | 307/270 X |
| 4,477,884 | 10/1984 | Iwahashi et al. | 307/449 X |

*Primary Examiner*—Larry N. Anagnos
*Attorney, Agent, or Firm*—James H. Fox

[57] ABSTRACT

A circuit generates complementary output signals which occur essentially simultaneously to each other. The circuit comprises three inverting and one non-inverting pairs of complementary transistors, typically field effect types. One of the inverting pairs provides the circuit inverted output. The output of the non-inverting pair is coupled to the output of another of the inverting pairs, which provide the circuit non-inverted output. In this manner, full $V_{ss}$ to $V_{cc}$ output levels are achieved for substantially symmetrical output signals.

10 Claims, 5 Drawing Figures

SYMMETRICAL OUTPUT COMPLEMENTARY BUFFER

BACKGROUND OF THE INVENTION

1. Field of the Invention

This invention relates to buffer-inverter circuits implemented with complementary transistors.

2. Description of the Prior Art

A conventional complementary metal-oxide-silicon (CMOS) address buffer receives a digital input signal having TTL or MOS input potential levels and generates an inverted and a non-inverted output signal, which are complementary signals and have MOS potential levels; see, e.g., FIG. 1. The inverted output signal $\overline{A}$ is delayed from the input signal by a pair of complementary MOS inverter transistors (T10, T11). This inverted signal ($\overline{A}$) is typically inverted a second time to generate a non-inverted output signal A'. Thus there is an additional delay introduced such that the non-inverted output signal at node 16 occurs later in time than the inverted output signal at node 15. This delay is especially significant when the load capacitance (17) connected to the inverted output node (15) is large compared to the input capacitance of the transistors (T12, T13) in the second inverter.

In some applications, it is desirable that the inverted output signal and the non-inverted output signal both change states at essentially the same time. For example, in one type of static random access memory, it is desirable to select one row of memory cells at essentially the same time that another row is de-selected. For this purpose, it is desirable to have a complementary address buffer-inverter in which complementary output signals are generated that both start their transition at the same time, cross through the midway point of their logic swing at essentially the same time and reach the final logic levels at almost the same time. Numerous other applications are also possible.

SUMMARY OF THE INVENTION

I have invented circuit which generates complementary output signals from an input signal. The circuit typically comprises three inverting pairs of complementary transistors, and one non-inverting pair. The transistors are insulated gate field effect types in one embodiment, but may be other types, including bipolar types. A first and second inverting pair, and the non-inverting pair have all of their inputs coupled to a common circuit node, with the output node of the first inverting pair providing the inverted output signal. The output of the second inverting pair of transistors is coupled to the input of the third inverting pair of transistors. The outputs of the third inverting pair and the non-inverting pair of transistors are coupled to a common output node that provides the non-inverted output signal.

DETAILED DESCRIPTION

Figure 2:
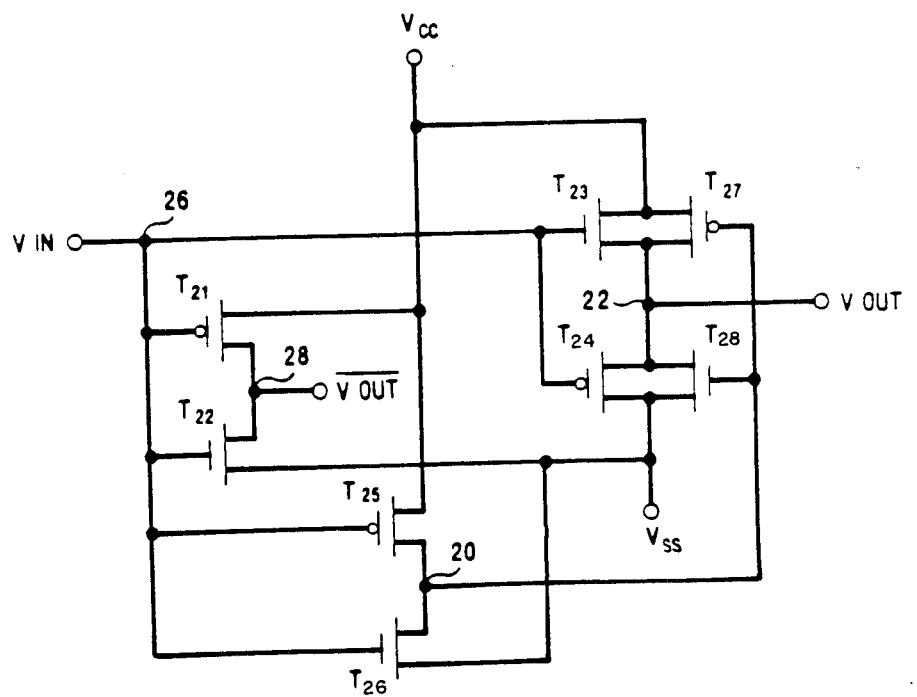
FIG. 2 shows one embodiment of the inventive symmetrical inverter.

The following detailed description relates to a circuit that obtains more nearly symmetrical complementary outputs than typical prior art designs. The present technique is illustrated in terms of field effect transistors of opposite conductivity types, e.g., p-channel and n-channel insulated gate types. In particular, an implementation with metal-oxide-silicon (MOS) field effect transistors is illustrated. However, other complementary transistor types, such as junction field effect transistor and npn and pnp bipolar types, are possible. Referring to FIG. 2, a first complementary inverter comprises p-channel transistor T21 and n-channel transistor T22. The gates of T21 and T22 are coupled to input node 26, which is adapted to receive input signal VIN. The source electrode of T21 is coupled to a positive source of potential (Vcc), and the source electrode of T22 is coupled to a negative source of potential (Vss). The drain electrodes of T21 and T22 are coupled to an output node 28, at which inverted signal $\overline{VOUT}$ appears. The signal $\overline{VOUT}$ is an inversion of VIN, and delayed in time from VIN by the delay of the first inverter.

Figure 3:
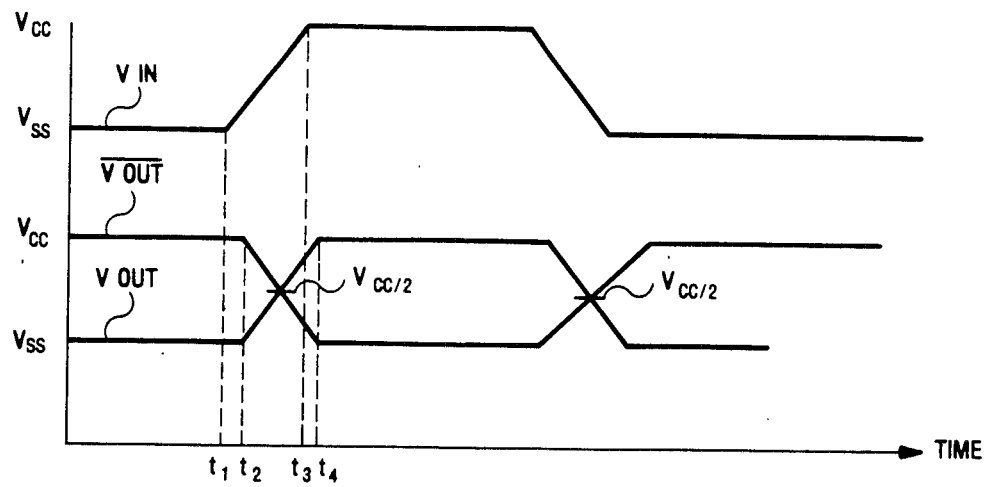
FIG. 3 shows voltage waveforms for the circuit of FIG. 2.

A time representation of the signals $\overline{VOUT}$ and VIN is given in FIG. 3. A positive-going transition of VIN at time t1 initiates a negative-going transition of $\overline{VOUT}$ at t2; the end of this transition occurs at t3 for VIN and t4 for $\overline{VOUT}$. Conversely, a negative-going transition of VIN initiates a positive-going transition of $\overline{VOUT}$. As represented, the delay of $\overline{VOUT}$ from VIN is about the same for the negative and positive transitions. However, these delays may be different, due to differences in gain or threshold voltage between T21 and T22, among other reasons.

Referring again to FIG. 3, the input signal VIN is also coupled to a non-inverting complementary pair comprising n-channel transistor T23 and p-channel transistor T24. Note that these complementary transistors are serially connected in the opposite order as those of the first inverter, with the drain of the n-channel transistor T23 being coupled to the more positive power supply potential (Vcc), and the drain of p-channel transistor T24 being coupled to the more negative power supply potential (Vss). The source electrodes of T23 and T24 are coupled to output node 22, at which the signal VOUT appears. Since the pair of T23–T24 is a non-inverting pair, they produce a voltage at output node 22 that is of the same polarity as VIN. Ideally, the time delay through this pair is the same as through the inverting pair T21–T22. However, T23 and T24 conduct only as long as VIN exceeds their respective threshold voltages. Hence, T23 and T24 do not by themselves achieve a full MOS output voltage swing from Vss to Vcc.

To achieve a full Vss to Vcc output voltage swing, two additional inverters are utilized. Complementary inverter T25–T26 inverts the input signal VIN, and applies it to intermediate node 20, which is coupled to the input of complementary inverter T27–T28. The output of inverter T27–T28 is coupled to the circuit output node 22, where it adds to the output of the pair T23–T24. In operation, when the input signal VIN makes a transition from one voltage level to another, the non-inverting pair T23–T24 first begins to change the voltage level on output node 22 accordingly. For example, when VIN makes a low to high transition, T23 begins to conduct as soon as VIN exceeds the threshold voltage of T23, thus increasing the voltage on output node 22. Note, however, that T28 is also initially conducting during the initial portion of this transition, so that a voltage division between T23 and T28 occurs. When VIN is inverted by T25– T26 and appears at node 20, the (low) level produced thereby turns T28 off, and also turns T27 on. This removes the pull-down effect of T28, allowing both T23 and T27 to pull output node 22 up. Note that T23 can pull node 22 up to only within a threshold voltage of Vcc, but T27 supplied the additional pull-up to substantially the full Vcc level.

Figure 1:
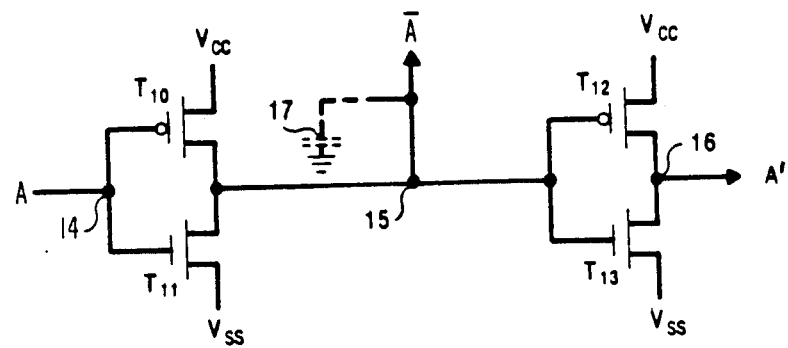
FIG. 1 shows a typical prior art arrangement of two inverters for generating an inverted and non-inverted output signal.

The resulting waveforms are typically as represented in FIG. 3, wherein the inverted output signal $\overline{VOUT}$ (node 28) and the non-inverted output signal VOUT (node 22) are shown. It has been found that in a typical case, these waveforms are practically symmetrical, even though VOUT is produced in part by additional circuitry that produces additional delays. In particular, when the time difference between t1 and t3, which represents the rise time of VIN, is about 5 nanoseconds, then the midpoints of VOUT and $\overline{VOUT}$ occur at practically the same time. That is, the crossing of VOUT and $\overline{VOUT}$ occurs at nearly the midpoint of the power supply voltages, Vcc/2. I estimate that typical implementations of the present technique can readily achieve the crossing of VOUT and $\overline{VOUT}$ to occur at a voltage less than 10 percent different than the midpoint; for example, within the range of 2.25 to 2.75 volts for power supply of Vcc=5 volts and Vss=0 volts. This contrasts to the scheme shown in FIG. 1, wherein the second inverter does not begin to change state until the voltage at node 15 (the $\overline{A}$ signal) exceeds a threshold voltage drop of one of the transistors in the second inverter (T12–T13). By the time that the resulting signal appears at node 16 (the A' signal), the $\overline{A}$ voltage is typically well past the midpoint. Hence, the crossing of $\overline{A}$ and A' typically occurs significantly outside the above-noted range. That is, the crossing occurs at a voltage much below the midpoint for a positive-going transition of VIN, and much above the midpoint for a negative-going transition of VIN.

Figure 4:
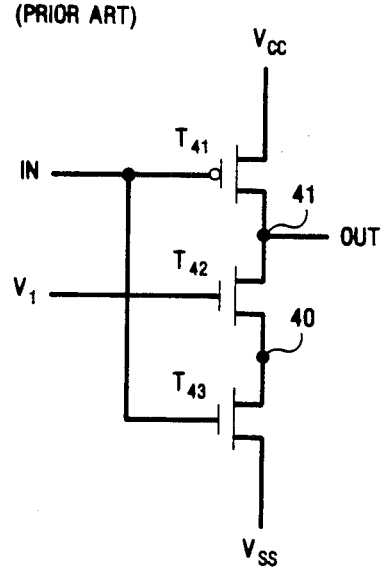
FIGS. 4 and 5 show alternative inverting and non-inverting stages.
Figure 5:
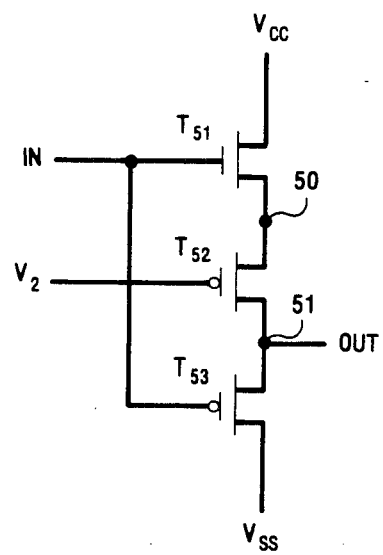

Other implementations of the circuit function shown in FIG. 2 are possible. For example, it is known to implement a complementary inverter using a protective voltage-dropping transistor to minimize the effects of "hot carriers" or other voltage-related degradation phenomena on one or both of the inverter transistors. As shown in FIG. 4, the protective transistor T42 reduces the maximum voltage on T43 to a value of V1–Vth, where V1 is the value of the gate voltage on T42, and Vth is the threshold voltage drop of T42. For example, if V1=5.5 volts and Vth=1.2 volts, then a maximum of 4.3 volts appears across the source-drain electrodes of T43. Note that this circuit preserves the full Vss to Vcc output voltage swing at node 41, which serves as the output node for pair T41–T43. To provide protection to the non-inverting complementary pair, the circuit of FIG. 5 may be used. The protective transistor T52 has a relatively low voltage V2, perhaps 0 volts, applied to its gate. This limits the voltage at node 50 to being no more negative than V2–Vth, where Vth is here the threshold of protective transistor T52. For example, if V2=0 volts and Vth=1.2 volts, then node 50 does not go below 1.2 volts. Hence, the inverter transistor T51 has no more than 5−1.2=3.8 volts applied thereacross, assuming Vcc=5 volts. This circuit provides a voltage swing to within a threshold (of T51 and T53) of Vss and Vcc at node 51, which serves as the output node for pair T51-T53. It also provides protection to 51 even when full Vss to Vcc levels are achieved with an inverter pair. While the protection of the n-channel transistors is shown in FIGS. 4 and 5, since these are the most vulnerable in current MOS technology, the protection of the p-channel transistors (T42, T53) can be implemented in a comparable manner.

The inventive circuit may comprise additional transistor pairs. For example, additional output capability may be obtained by adding inverters between each output node and the circuitry driven thereby. An even number of inverters may be provided between node 20 and the input electrodes of T27–T28. Similarly, an even number of inverters may be provided between input node 26 and the input electrodes of inverting pair T21-T22 and non-inverting pair T23-T24. A comparable delay, typically provided by using the same number of additional inverters in each path, is typically introduced into each path when additional pairs are used.

What is claimed is:

1. Circuitry comprising:
   first, second, third, fourth, fifth, and sixth transistors T21, T22, T23, T24, T27, and T28, respectively, each having a control electrode and first and second output electrodes;
   T21, T24, and T27 being of a first conductivity type, and T22, T23 and T28 being of the opposite conductivity type;
   the control electrodes of T21, T22, T23 and T24 being coupled together to a circuitry input node;
   the second output electrode of T21 being coupled to the second output electrode of T22 and to a first circuitry output node;
   the control electrodes of T27 and T28 being coupled to an intermediate node which is characterized to be at a potential level that is the inverse of the level applied to the circuitry input node;
   the first output electrodes of T23 and T24 being coupled to the second output electrodes of T27 and T28 and to a second circuitry output node;
   the first output electrodes of T21 and T27, and the second output electrode of T23, being adapted to be coupled to a first potential source; and
   the first output electrodes of T22 and T28, and the second output electrode of T24, being adapted to be coupled to a second potential source which has a different potential level than the first potential source.

2. Circuitry of claim 1 wherein:
   T21, T24, and T27 are p-channel field effect transistors, and
   T22, T23, and T28 are n-channel field effect transistors; wherein said first output electrodes thereof are source electrodes, and said second output electrodes thereof are drain electrodes.

3. Circuitry of claim 2 wherein:
   T21, T22, T23, T24, T27, and T28 are insulated gate field effect transistors.

4. Circuitry of claim 1 wherein:
   when the circuitry is in operation, said first circuitry output node and said second circuitry output node are characterized to produce simultaneous complementary full output potential levels.

5. Circuitry comprising:
   first, second, third, fourth, fifth, sixth, seventh and eighth field effect transistors T21, T22, T23, T24, T25, T26, T27 and T28, respectively, each having a gate electrode, a source electrode, and a drain electrode;

T21, T24, T25 and T27 being of a first conductivity type, and T22, T23, T26 and T28 being of the opposite conductivity type;

the gate electrodes of T21, T22, T23, T24, T25, and T26 being coupled together to an input circuitry node;

the drain electrode of T21 being coupled to the drain electrode of T22 and to a first circuitry output node;

the drain electrode of T25 being coupled to the drain electrode of T26 and to the gate electrodes of T27 and T28;

the source electrodes of T23 and T24 being coupled to the drain electrodes of T27 and T28 and to a second output circuitry node;

the source electrodes of T21, T25, and T27, and the drain electrode of T23, being adapted to be coupled to a first potential source; and the source electrodes of T22, T26, and T28, and the drain electrode of T24, being adapted to be coupled to a second potential source which has a different potential level than the first potential source.

6. Circuitry of claim 5 wherein:

T21, T22, T23, T24, T25, T26, T27 and T28 are insulated gate field effect transistors.

7. Circuitry of claim 6 wherein:

T21, T24, T25 and T27 are p-channel transistors, and T22, T23, T26 and T28 are n-channel transistors.

8. Cicuitry of claim 5 wherein:

when the circuitry is in operation, its first and second output nodes are characterized to produce simultaneous complementary full potential levels.

9. Circuitry compising:

first, second, and third inverting pairs of complementary field effect transistors, and a non-inverting pair of complementary field effect transistors, with each pair having an input node and an output node, the transistors of each pair being serially coupled together;

a circuitry input node coupled to the input node of each of the first and second inverting pairs, and the non-inverting pair of transistors;

the output node of the second inverting pair of transistors being coupled to the input node of the third inverting pair of transistors;

a first circuitry output node being coupled to the output node of the first inverting pair of transistors;

a second circuitry output node being coupled to the output node of each of the third inverting pair and the non-inverting pair of transistors.

10. Circuitry comprising:

an input node adapted to receive an input signal;

a first pair of inverting complementary transistors having an input connected to said input node and an output connected to an inverted output node;

a second pair of inverting complementary transistors having an input connected to said input node and having an output adapted to provide an inverted signal to the input of a third pair of inverting complementary transistors having an output connected to a non-inverted output node;

and a pair of non-inverting complementary transistors having an input connected to said input node and having an output connected to said non-inverted output node.

* * * * *